(12) United States Patent
Thomas

(10) Patent No.: US 11,714,148 B2
(45) Date of Patent: Aug. 1, 2023

(54) CRYOSTAT FOR SUPERCONDUCTIVE MAGNET

(71) Applicant: Siemens Healthcare Limited, Camberley (GB)

(72) Inventor: Adrian Mark Thomas, Bicester (GB)

(73) Assignee: Siemens Healthcare Limited, Camberley (GB)

( * ) Notice: Subject to any disclaimer, the term of this patent is extended or adjusted under 35 U.S.C. 154(b) by 44 days.

(21) Appl. No.: 16/722,250

(22) Filed: Dec. 20, 2019

(65) Prior Publication Data

US 2020/0200847 A1    Jun. 25, 2020

(30) Foreign Application Priority Data

Dec. 20, 2018 (GB) ..................................... 1820782

(51) Int. Cl.
| | |
|---|---|
| G01R 33/38 | (2006.01) |
| G01R 33/3815 | (2006.01) |
| F17C 3/08 | (2006.01) |
| F17C 13/00 | (2006.01) |
| G01R 33/385 | (2006.01) |
| H01F 6/06 | (2006.01) |

(52) U.S. Cl.
CPC .......... *G01R 33/3815* (2013.01); *F17C 3/085* (2013.01); *F17C 13/007* (2013.01); *G01R 33/3856* (2013.01); *H01F 6/06* (2013.01)

(58) Field of Classification Search
CPC .......... F17C 3/08; F17C 3/085; F17C 13/006; F17C 13/007; F17C 13/0087; H01F 6/06; G01V 3/00; A61N 2005/005
See application file for complete search history.

(56) References Cited

U.S. PATENT DOCUMENTS

| | | | |
|---|---|---|---|
| 5,291,169 | A | 3/1994 | Ige et al. |
| 5,412,363 | A | 5/1995 | Breneman et al. |
| 5,610,521 | A * | 3/1997 | Zou .................. G01R 33/34 |
| | | | 324/318 |
| 5,729,141 | A | 3/1998 | Hass et al. |
| 5,874,880 | A * | 2/1999 | Laskaris ............ G01R 33/3806 |
| | | | 335/216 |
| 5,939,962 | A | 8/1999 | Tahara et al. |
| 5,952,830 | A | 9/1999 | Petropoulos et al. |

(Continued)

FOREIGN PATENT DOCUMENTS

| | | |
|---|---|---|
| CN | 1174328 A | 2/1998 |
| CN | 101118798 A | 2/2008 |

(Continued)

OTHER PUBLICATIONS

Chinese Office Action dated Jun. 15, 2021 for Chinese Patent Application No. 201911320940.8.

*Primary Examiner* — Brian M King
(74) *Attorney, Agent, or Firm* — Banner & Witcoff Ltd.

(57) ABSTRACT

A split cylindrical superconducting magnet system including two half magnets, each half magnet comprising superconducting magnet coils retained in an outer vacuum chamber, having a thermal radiation shield located between the magnet coils and the outer vacuum chamber, wherein the thermal radiation shield is shaped such that the axial spacing between thermal radiation shields of respective half magnets is greater at their internal diameter than at their outer diameter.

14 Claims, 6 Drawing Sheets

(56) References Cited

U.S. PATENT DOCUMENTS

| | | |
|---|---|---|
| 6,462,547 B1 | 10/2002 | Heid et al. |
| 6,531,870 B2 | 3/2003 | Heid et al. |
| 6,552,543 B1 | 4/2003 | Dietz |
| 10,173,077 B2 * | 1/2019 | Overweg ............ A61N 5/1049 |
| 10,413,751 B2 * | 9/2019 | Dempsey ............ A61N 5/1049 |
| 2002/0145426 A1 * | 10/2002 | Minas ............... G01R 33/3806 |
| | | 324/309 |
| 2006/0290351 A1 | 12/2006 | Matsumoto |
| 2007/0063801 A1 * | 3/2007 | Laskaris ............ G01R 33/3815 |
| | | 335/301 |
| 2015/0077118 A1 | 3/2015 | Shvartsman et al. |
| 2017/0120074 A1 * | 5/2017 | Calvert ............. G01R 33/4808 |

FOREIGN PATENT DOCUMENTS

| | | |
|---|---|---|
| CN | 101493505 A | 7/2009 |
| DE | 19927494 A1 | 10/2000 |
| DE | 10156770 A1 | 12/2000 |
| DE | 19940551 C1 | 5/2001 |
| DE | 10331809 B3 | 7/2003 |
| EP | 0924530 A2 | 6/1999 |
| GB | 2306007 A | 4/1997 |
| JP | 2005144132 A | 6/2005 |
| WO | 0227345 A1 | 4/2002 |
| WO | WO2011/106524 A1 | 2/2010 |

* cited by examiner

CRYOSTAT FOR SUPERCONDUCTIVE MAGNET

FIELD OF THE DISCLOSURE

The present disclosure relates to superconducting magnets, such as superconducting magnets for use in MRI (Magnetic Resonance Imaging) systems. In particular, it relates to the form of a cryostat which encloses superconducting magnet coils and holds them at a cryogenic operating temperature.

BACKGROUND

FIG. 1 shows an example cryostat arrangement 10 for a split superconducting magnet. The arrangement is essentially symmetrical about magnet axis A-A. Magnet coils 12 may be enclosed within respective half-cryogen vessels 14. The gap 24 between cryogen vessels allows access to imaging region 26 for a treatment radiation beam 20 from associated radiation treatment apparatus 22. In alternative arrangements, such access may be provided for other therapy techniques e.g. biopsy, or combined with other diagnostic systems such as CT or angiography. In use, the cryogen vessel is partially filled with a liquid cryogen such that the magnet coils 12 are partially immersed in liquid cryogen. In other conventional arrangements, no cryogen vessel is provided and other arrangements are provided to cool the superconducting coils. In any case, the magnet coils 12 and the cryogen vessel 14 (if any) are surrounded by at least one thermal radiation shield 16 (also known as a "cryoshield"), which is itself enclosed within a respective outer vacuum chamber ("OVC") 18.

The magnet coils 12 provide a high-strength, high-homogeneity background magnetic field. Gradient field coils 19 provide a set of orthogonal magnetic fields that oscillate at various frequencies, as required by an imaging sequence when in use. Problems may arise in use in that the oscillating magnetic fields of the gradient coils may induce oscillating electrical currents in the material of the thermal radiation shield(s) 16. These oscillating electrical currents will in turn generate heat, so-called "gradient coil induced heating", and oscillating magnetic fields which will interfere with the imaging procedure. Typically, the thermal radiation shield(s) 16 will be of a material of high electrical conductivity such as aluminium, copper or a metal-loaded composite material. The outer vacuum container 18 and the cryogen vessel 14, if any, will typically be of a material of lower electrical conductivity such as stainless steel. Due to lower electrical conductivity, eddy currents and heating caused by eddy currents is of much less effect in an OVC 18 or cryogen vessel 14 of stainless steel than in a thermal radiation shield 16 of aluminium or copper.

In "wet" systems, where magnet coils are partially immersed in liquid cryogen, power dissipation caused by electrical currents due to gradient coil induced heating causes further boil-off of liquid cryogen. The heat introduced by gradient coil induced heating must be removed by an associated cryogenic refrigerator to recondense the boiled-off cryogen. Such an approach is not possible in a "dry" system, where no cryogen vessel is provided. Such "dry" or "cryogen-free" systems are advantageous to reduce the cost of the system and to eliminate the need for quench-venting penetrations to be made in a radiation shielded room.

Efforts have been made to reduce the effects of gradient coil induced heating by adding gradient shield coils, but the presence of these takes up space within the bore of a cylindrical magnet, meaning that the diameter available for a patient is reduced, and/or larger diameter coils are required.

SUMMARY

The present disclosure aims to reduce the effect of such oscillating gradient magnetic fields on the imaging procedure, by reducing the amount of magnetic coupling, and so eddy currents, in the thermal radiation shield(s), cryogen vessel and outer vacuum chamber.

The present disclosure particularly relates to combined imaging and radiation therapy systems. As illustrated in FIG. 1, this typically involves a split superconducting magnet, with a gap 24 at the axial mid-point of the magnet. A radiation therapy beam emitter 22 is arranged to provide a radiation therapy beam 20 perpendicularly to a magnet axis A-A into imaging region 26 through the gap 24 between two halves of the superconducting magnet. Each half of the superconducting magnet comprises one or more superconducting magnet coils 12 suitably maintained in position within respective OVC 18. A thermal radiation shield 16 is provided between the superconducting magnet coils and the respective OVC. If the superconducting magnet is a "wet" magnet, a cryogen vessel 14 is provided around the superconducting coils.

In order to provide access for the radiation therapy beam emitter 22, or for other alternative or additional equipment such as equipment for biopsy, or other diagnostic systems such as CT or angiography, the gradient field coils 19 are also split between the two magnet halves. To reduce the effect of the gradient magnet fields on conductive components such as thermal radiation shields 16, it is conventional to include gradient shield coils radially outside of the gradient coils. The gradient shield coils oppose the magnetic field generated by the gradient field coils and so reduce the effective strength of the magnetic field reaching the conductive component. As shown in FIG. 1, in order to provide access for the radiation therapy beam emitter 22, the gradient shield coils 19 are also split between the two magnet halves. This means that the shielding effect of the gradient shield coils is much reduced in the gap 24 between the two superconducting magnet halves. Due to the resultant imperfect shielding, some of the gradient magnetic fields will interact with the thermal radiation shield 16 in the vicinity of the gap 24 between the two halves of the superconducting magnet. The design of such a split gradient coil requires a non-ideal placement of conductors from the point of view of generating the required gradient fields. The non-ideal placement of conductors for gradient field coils and gradient shield coils causes increased eddy currents within the material of the thermal radiation shields 16 of the superconducting magnet halves. These increased eddy currents cause power dissipation in the material of the thermal radiation shield 16. This will add heat load onto an associated cryogenic cooling arrangement, and reduce the purity of the magnetic field in the imaging region 26.

Examples of imaging systems with split superconducting magnet are presented for example in US2015/007118, U.S. Pat. No. 5,729,141, WO2011/106524, U.S. Pat. Nos. 5,952, 830, 5,291,169. DE10156770 shows an MRI device with a gradient coil system and an extra electrically conductive gradient shield structure.

Some conventional attempts to address this issue have included increasing the depth of the gradient coil to increase separation from the thermal radiation shield 16 and improve effectiveness of gradient coil shielding. The achieved improvements come at the expense of reduced available patient space, or requiring larger-diameter magnet coils which in turn increases their weight and material costs.

The present disclosure provides a modified architecture of thermal radiation shields which reduces heating thereof due to gradient field interaction.

In addition to heating of thermal radiation shields due to gradient field interaction, mechanical vibrations which occur in the thermal radiation shield generate eddy currents due to interaction with the magnet field, which produce heating and magnetic field fluctuations in the imaging region 26 of the magnet.

The present disclosure accordingly provides structures as defined in the appended claims.

BRIEF DESCRIPTION OF THE FIGURES

The above, and further, objects, characteristics and advantages of the present disclosure will become more apparent from the following description of certain embodiments thereof, given by way of non-limiting examples only, in conjunction with the appended drawings, wherein.

DETAILED DESCRIPTION

Figure 1:
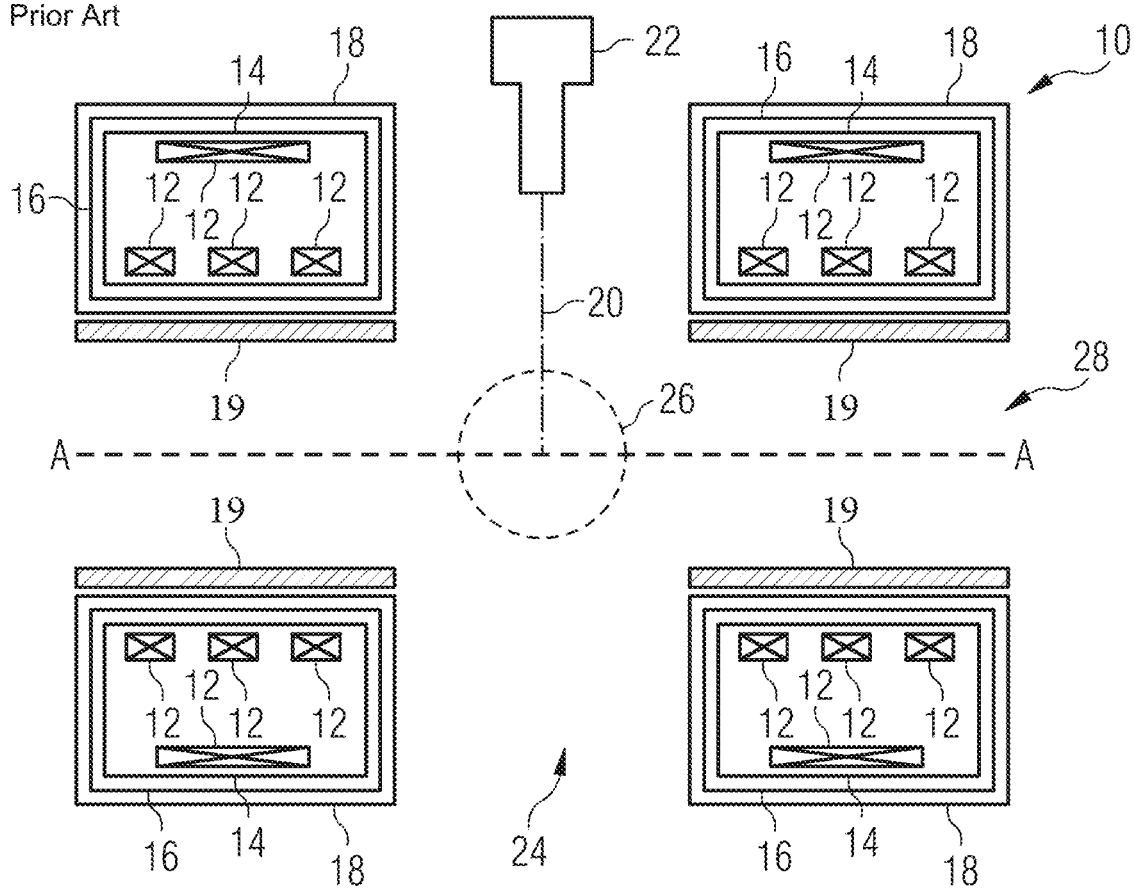
FIG. 1 schematically illustrates an example conventional cryostat arrangement 10 for a split superconducting magnet.

In designing a superconducting magnet, for example a magnet for an MRI system, with a central gap, superconducting magnet coil positions must be compromised. In the example of FIG. 1, for example, coils 12 may not be positioned at or near the axial midpoint of the magnet. In embodiments of the present disclosure, it can be determined that no superconducting coil should be placed close to the magnet bore 28 near the gap 26 between the two halves of the magnet. Conventional simulation and design methodology will allow coils to be positioned elsewhere and dimensioned appropriately to achieve a required background field.

Figure 2:
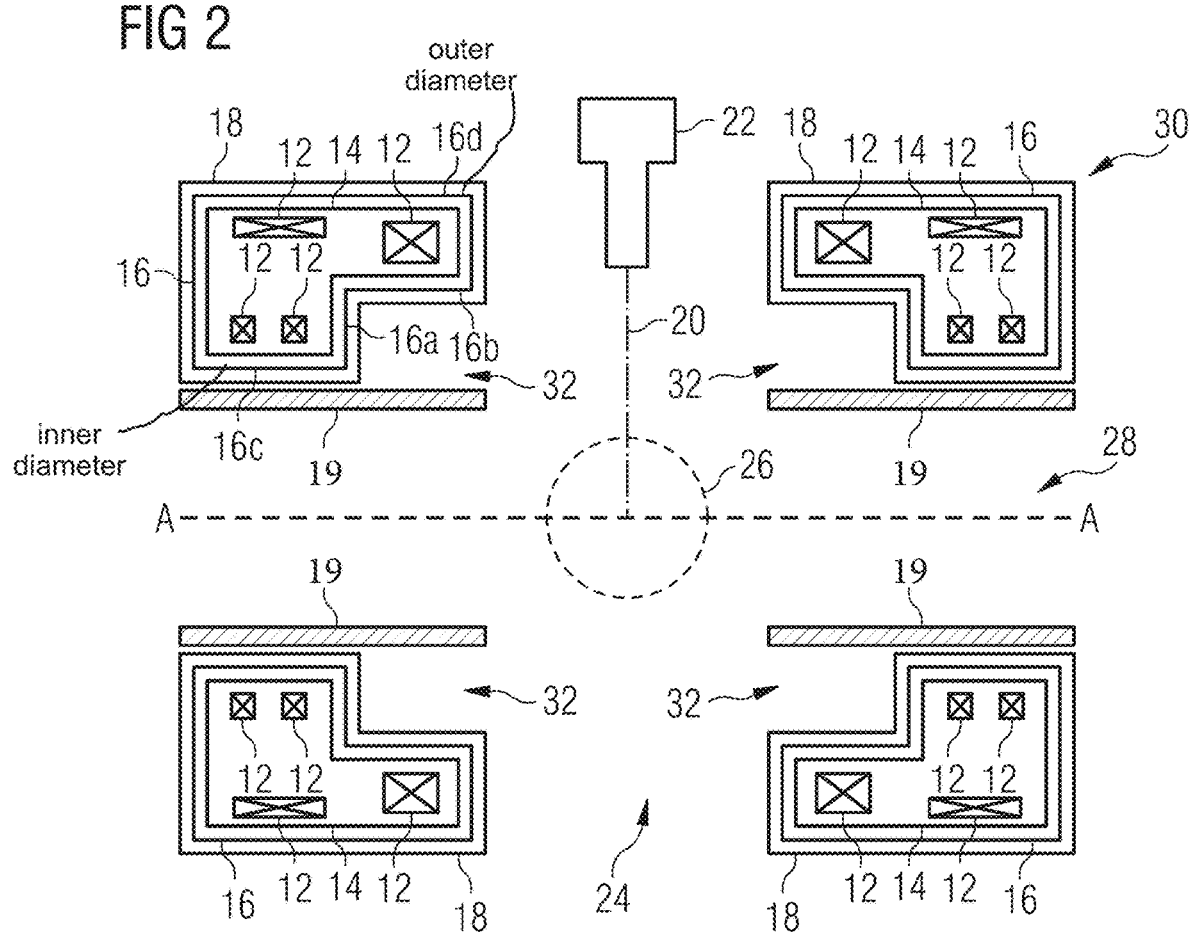
FIGS. 2-8 schematically illustrate example embodiments of the present disclosure.

The example design 30 represented on FIG. 2 shows that superconducting coils 12 are not located near to the magnet axis A-A in the vicinity of gap 24. According to a feature of the present disclosure, the thermal radiation shield 16 is shaped so as to be absent in the position nearest the imaging region 26. This may be achieved as illustrated in the drawing, by a step profile in the cylindrical shape of the thermal radiation shield 16, including a planar annular component 16a and a cylindrical component 16b of diameter intermediate between a diameter of an inner cylindrical surface 16c and a diameter of an outer cylindrical surface 16d.

The position nearest the magnet axis A-A and nearest the gap 24 is the position nearest to the imaging region 26 and is the region where magnetic field fluctuations will have the most deleterious effect on image quality. It is also in this region that gradient magnetic field interaction with the thermal radiation shield 16 is likely to be strongest. Eddy currents induced in surfaces like the thermal radiation shield 16 will generate their own opposing magnetic fields at the same frequency as the gradient field. These may interfere with the imaging fields in imaging region 26.

An advantage of the present disclosure is that the electrically conductive surface of the thermal radiation shield 16 is moved away from the position nearest the imaging region 26, which is also the position nearest the magnet axis A-A and nearest the gap 24. This depletes the magnitude of the induced eddy currents in the thermal radiation shield, because they are effective at a greater distance from the gradient coils 19 whose magnetic fields induce the eddy currents. The eddy currents are also induced further from the imaging region 26, and any effect of the eddy currents takes place further from the imaging region, depleting still further any deleterious effect on the magnetic field in the imaging region 26.

FIG. 2 shows an example embodiment where the profile of cryogen vessel 14, thermal radiation shield 16 and OVC 18 are changed.

Figure 3:
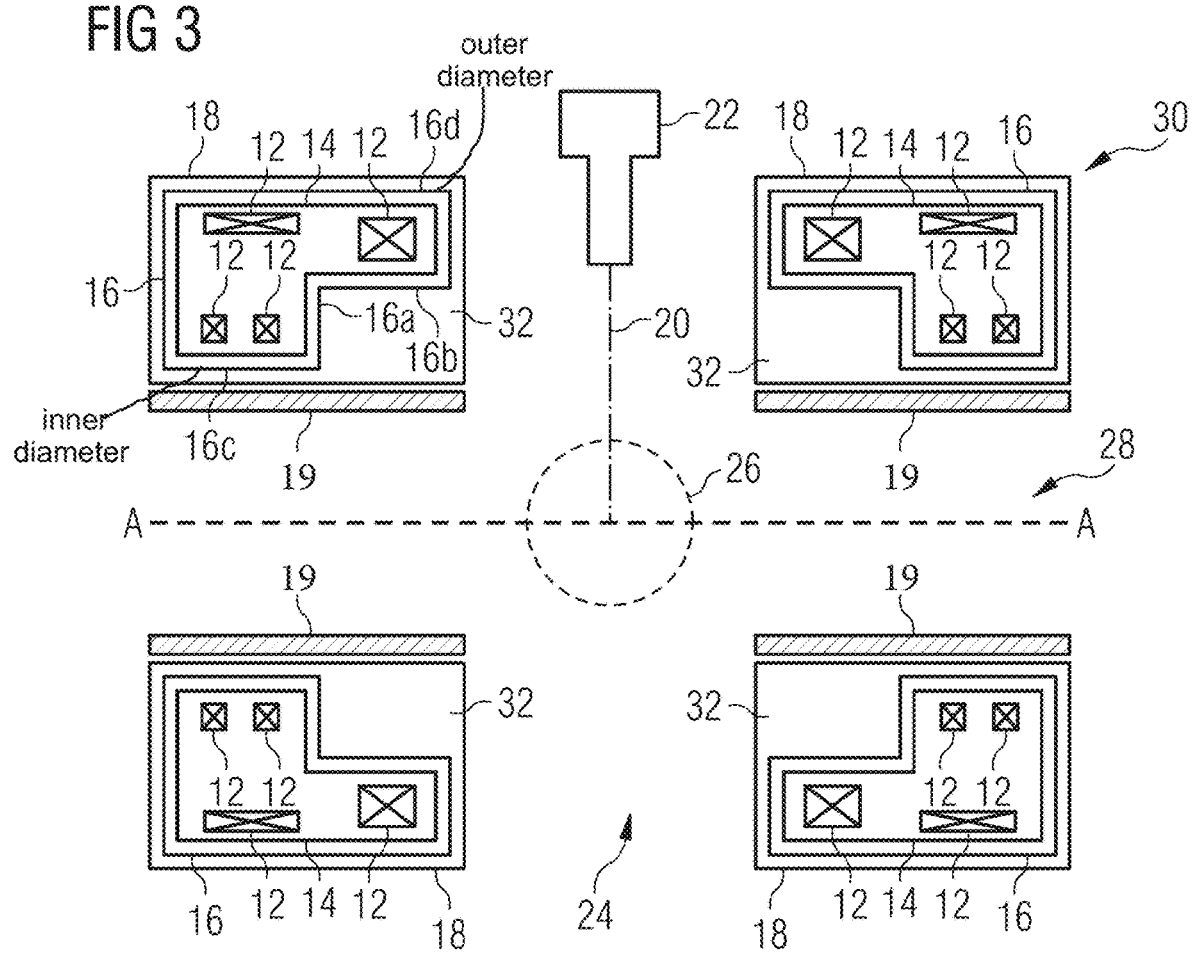

As illustrated in the embodiment of FIG. 3, the present disclosure may result in a changed profile of the thermal radiation shield 16 only, in embodiments which do not include a cryogen vessel 14; or changed profile of the thermal radiation shield 16 and cryogen vessel 14, while OVC 18 remains unchanged. Alternatively, as shown in the embodiment of FIG. 2, the thermal radiation shield 16 and the OVC 18 may be similarly shaped. In the example of FIG. 2, both the thermal radiation shield 16 and the OVC 18 are absent from the position nearest the magnet axis A-A and nearest the gap 24, that is, nearest the imaging region 26.

Figure 4:
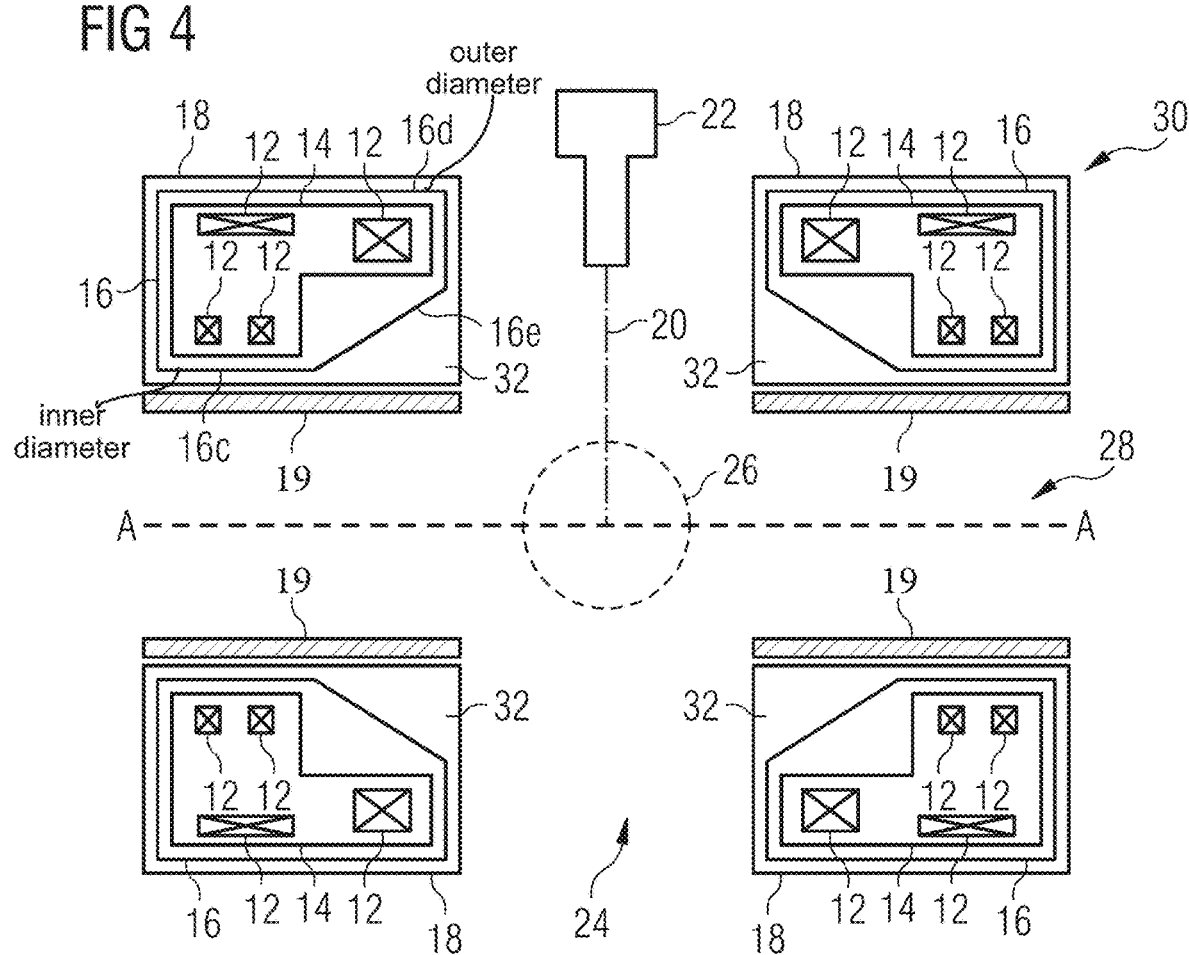
Figure 5:
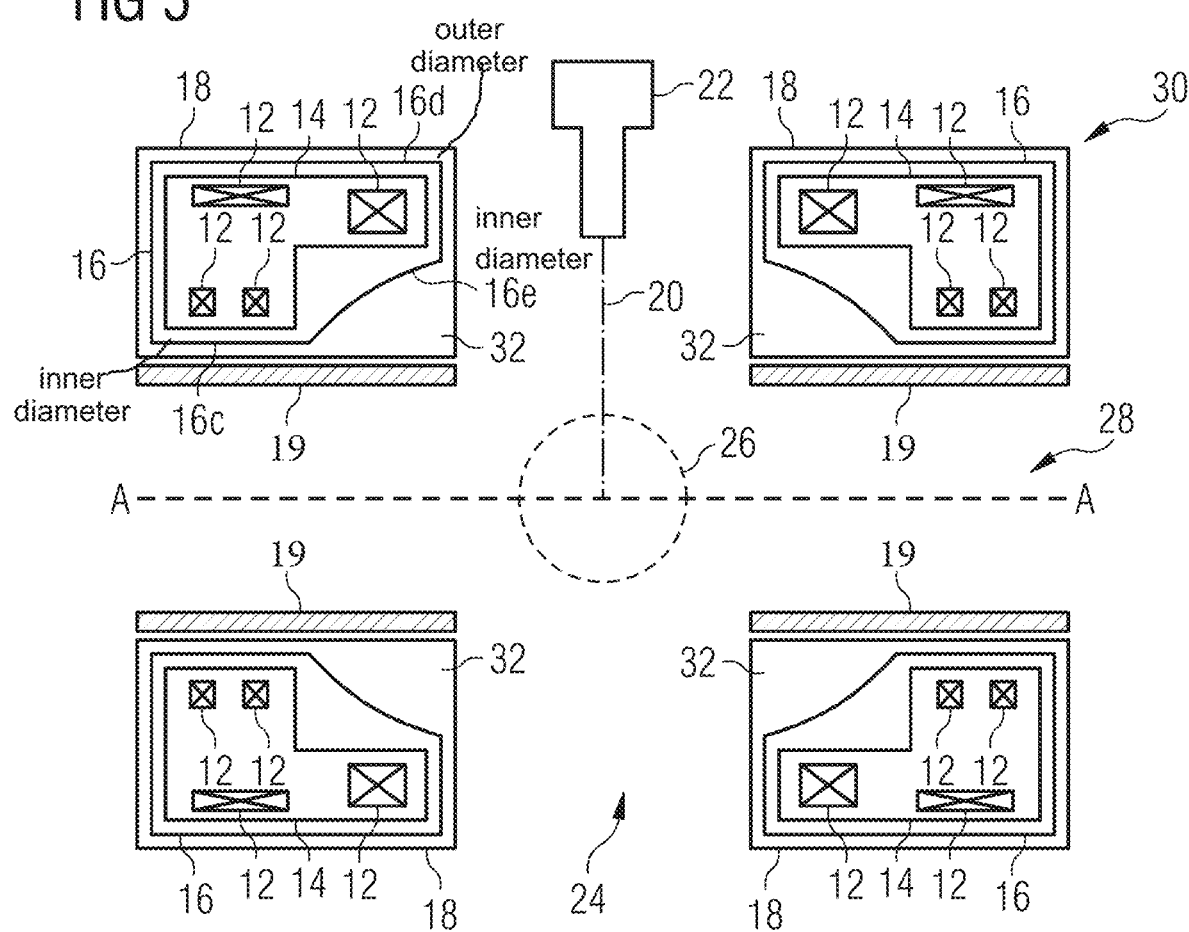

Alternatively to the arrangements of FIGS. 2-3 in which part of the thermal radiation shield 16 has a portion near imaging volume 26 with an increased inner diameter, alternative embodiments may be employed, as shown in FIGS. 4-5.

For example, in FIG. 4, part of the thermal radiation shield is chamfered, tapering from a minimum inner diameter at 16c to an increased inner diameter at 16e.

In FIG. 5, the thermal radiation shield has a concave dished, e.g. part-spherical, shape from a minimum inner diameter at 16c to an increased inner diameter at 16e. A similar, convex dished shape could alternatively be employed.

In preferred embodiments of the present disclosure, recesses 32 are provided near the axially and radially inner extremities of the thermal radiation shields (cryoshields) of respective half magnets. These recesses 32 may be employed to mount ancillary equipment or to provide improved access for an operator.

Using the example structure of FIG. 4, FIGS. 6-8 show examples of support structure which may be employed in magnet systems according to the present disclosure. The radiation shields are typically not structural, in which case the support geometry must separate the magnet coils. This can either be through structural components which are encased in the cryostat, or support the magnet coils on the OVC half, and then supporting the two halves.

As already discussed with reference to FIG. 4, part of the thermal radiation shield is chamfered, tapering from a minimum inner diameter at 16c to an increased inner diameter at 16e. In use, the two half magnet systems will experience very strong mutual attractive forces, in the order of several tonnes. In non-split cylindrical magnets, such attractive forces are typically borne by a structure directly supporting the magnet coils—such as a cylindrical former. In the systems of the present disclosure, a split magnet system is required, to allow access for radiation therapy equipment, or other equipment such as biopsy, CT or angiography equipment, to access the imaging region. Mechanical restraints must therefore be provided to bear the mutual attractive forces between the two half magnet systems.

Figure 6:
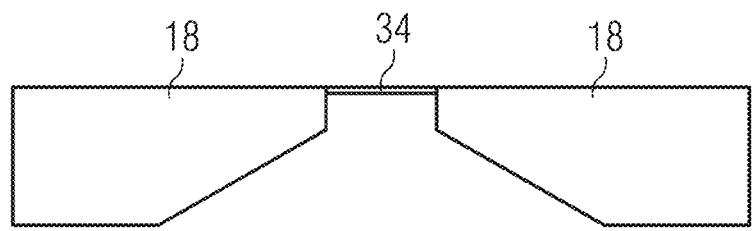

In FIG. 6, OVCs of the two half magnet systems are illustrated at 18. As in FIGS. 7-8, only a half-cross-section of the relevant component is shown, the component itself being essentially rotationally symmetrical about the magnet axis, which is not visible in this drawing. Mechanical support structure 34 is shown bearing against the two OVCs 18 at or near their outer diameters, at their axially inner extremities. The attractive force between the magnet coils would be transmitted through a coil mounting structure to the structure of the half OVCs, then the attractive force may be borne by the mechanical support structure 34. The mechanical support structure 34 is preferably intermittent around the circumference of the cylindrical superconducting magnet system, for example in the form of separate bars linking the two half OVCs 18 together. This allows access for the radiation treatment apparatus 22 or other apparatus such as biopsy, CT or angiography apparatus, which may form part of the apparatus of some embodiments of the present disclosure. Such radiation treatment apparatus requires a low attenuation path for the treatment beam 20.

Figure 7:
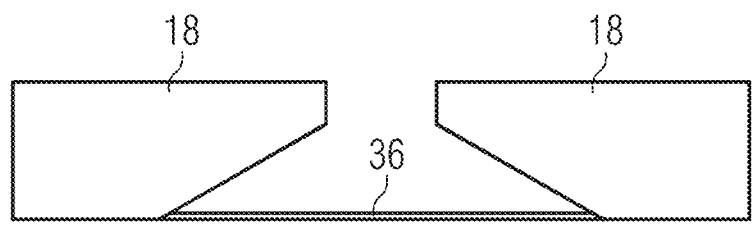

FIG. 7 illustrates a similar structure, but in which a mechanical support structure 36 is shown bearing against the two half OVCs at or near their inner diameters, at their axially and radially inner extremities. The attractive force between the magnet coils would be transmitted through a coil mounting structure to the structure of the half OVCs, then the attractive force may be borne by the mechanical support structure 36.

Figure 8:
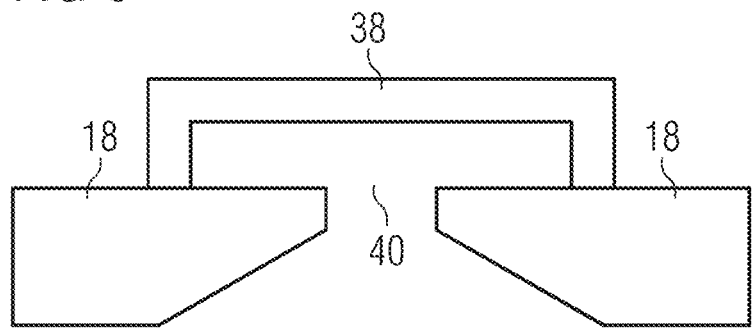

FIG. 8 illustrates an alternative structure, but in which mechanical support structure 36 is shown attached to the two half OVCs on their radially outer surfaces, away from their axially and radially inner extremities. The attractive force between the magnet coils would be transmitted through a coil mounting structure to the structure of the half OVCs, then the attractive force may be borne by the mechanical support structure 38. An advantage of such arrangement may be in that a cylindrical space 40 may be created, and that radiation treatment apparatus 22 may be provided in that cylindrical space 40, and be free to rotate about the magnet axis A-A.

In consideration of the effect on magnetic field quality in the imaging region 26, the worst (most troublesome) place to create eddy currents is near the axial midpoint of the magnet in the middle, nearest the imaging volume 26. That part of the cryoshield is removed in the present disclosure, to a more distant location, where interaction with gradient fields is reduced, and the effect of mechanically-induced magnetic field variations has little effect in the imaging region 26.

As provided in the present disclosure, the absence of conductive materials of the thermal radiation shield removes the need for the gradient coil to have effective magnetic shielding in the volume nearest the imaging region 26.

Mechanical vibrations which may occur in the thermal shield generate eddy currents due to interaction with the magnetic field of the superconducting magnet. Such eddy currents produce magnetic field fluctuations in the imaging region 26 of the magnet. By recessing the thermal radiation shield ("cryoshield"), it is moved further away from the imaging volume 26 and such eddy current induced fields are correspondingly displaced away from the imaging region.

By integrating the field contribution along the thermal shield, a reduction by a factor of 2 may be achieved relative to an integrated field contribution of a conventional non-recessed thermal shield. The energy absorbed by the thermal shield is created by an accumulation of the gradient stray field along the whole length of the bore due to the eddy currents induced. If significant portions of this bore tube are removed, or transferred to a larger diameter, as proposed in the present disclosure, the eddy current power dissipation is reduced.

The recessed shape also improves mechanical stiffness of the thermal radiation shield, which should also contribute to a reduction in eddy current generation by reduction in magnitude of mechanical oscillations.

The recess feature can apply to the thermal radiation shield only (and any cryogen vessel) or to the OVC as well. Although the OVC is typically made of a relatively resistive material such as stainless steel, which will not suffer greatly from eddy current effects, some OVCs are made of a more conductive material such as aluminium. Such OVC may suffer from eddy current effects, and so may benefit from the recessed shape proposed by the present disclosure.

For "wet" magnet systems which include a cryogen vessel, the cryogen vessel must also be recessed, to provide space for the recess in the thermal radiation shield.

In all embodiments, however, the thermal radiation shield (cryoshield) is shaped such that, at its closest point, it is further from the imaging region 26 than it would be if it were of simple rectangular half-cross-section.

The disclosure accordingly provides a split cylindrical superconducting magnet system such as may be employed in a combined MRI-radiation therapy system, comprising two half magnets, each half magnet comprising superconducting magnet coils 12 retained in an outer vacuum chamber 18, having a thermal radiation shield (cryoshield) 16 located between the magnet coils 12 and the outer vacuum chamber 18, wherein the thermal radiation shield (cryoshield) 16 is shaped such that the axial spacing between thermal radiation shields (cryoshields) 16 of respective half magnets is greater at their internal diameter 16a than at their outer diameter 16d. Such shaping of the thermal radiation shields (cryoshields) of respective half magnets relaxes the requirement for shielding of the thermal radiation shields (cryoshields) of respective half magnets from oscillating magnetic fields of the gradient coils 19. This may simplify design of gradient field coils and/or gradient shield coils. The effect of eddy currents generated by mechanical vibration of the thermal radiation shields (cryoshields) within a static background field may be reduced by a factor of two, so improving the stability of the magnetic field for imaging.

The invention claimed is:

1. A split closed bore superconducting magnet system having two half magnets, each half magnet comprising:
    superconducting magnet coils retained in an outer vacuum chamber defining a magnet bore along an axis of rotational symmetry of the split closed bore superconducting magnet system, wherein the two half magnets are spatially separated by a gap along the axis of rotational symmetry;
    a gradient field coil located between the superconducting magnet coils and the axis of rotational symmetry; and
    a thermal radiation shield located between the superconducting magnet coils and the outer vacuum chamber, wherein the thermal radiation shield is shaped such that axial spacing between the thermal radiation shields of the half magnets has an internal diameter greater than an outer diameter, and the thermal radiation shield is shaped so as to be absent in a position nearest an imaging region and nearest the gradient field coils of the half magnets.

2. The split closed bore superconducting magnet system according to claim 1, wherein the thermal radiation shield is shaped so as to be absent in a position nearest the imaging region by a step profile in a cylindrical shape of the thermal radiation shield.

3. The split closed bore superconducting magnet system according to claim 1, wherein a contour of the thermal radiation shield corresponds with a contour of the outer vacuum chamber.

4. The split closed bore superconducting magnet system according to claim 1, wherein the thermal radiation shield is chamfered, tapering from a minimum inner diameter to an increased inner diameter.

5. The split closed bore superconducting magnet system according to claim 1, wherein the thermal radiation shield has a concave dished shape from a minimum inner diameter to an increased inner diameter.

6. The split closed bore superconducting magnet system according to claim 1, wherein the thermal radiation shield has a convex dished shape from a minimum inner diameter to an increased inner diameter.

7. The split closed bore superconducting magnet system according to claim 1, wherein each of the two half magnets have recesses provided near an axial and radial extremity of the thermal radiation shield in each of the two half magnets.

8. The split closed bore superconducting magnet system according to claim 7, wherein the recesses are employed to mount ancillary equipment or to provide improved access for an operator.

9. The split closed bore superconducting magnet system according to claim 1, further comprising structural components which are encased in the outer vacuum chamber of each of the two half magnets and separate the superconducting magnet coils within each of the two half magnets.

10. The split closed bore superconducting magnet system according to claim 1, further comprising structural components which support the superconducting magnet coils of each of the two half magnets on the outer vacuum chamber of each half magnet.

11. The A split closed bore superconducting magnet system according to claim 10, wherein a mechanical support structure bears against each outer vacuum chamber of each half magnet at an axial inner extremity of each of the outer vacuum chambers of each half magnet.

12. The split closed bore superconducting magnet system according to claim 11, wherein the mechanical support structure is intermittent around a circumference of the split closed bore superconducting magnet system.

13. The split closed bore superconducting magnet system according to claim 10, wherein a mechanical support structure bears against each outer vacuum chamber of each half magnet at or near an inner diameter of each of the outer vacuum chambers of each half magnet.

14. The split closed bore superconducting magnet system according to claim 10, wherein a mechanical support structure is attached to a radial outer surface of each of the outer vacuum chambers of each half magnet.

* * * * *